United States Patent
Kitagawa

(10) Patent No.: US 6,788,109 B2
(45) Date of Patent: Sep. 7, 2004

(54) ASYNCHRONOUS DATA TRANSFER BETWEEN LOGIC BOX WITH SYNCHRONIZATION CIRCUIT

(75) Inventor: Kenji Kitagawa, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 10/160,109

(22) Filed: Jun. 4, 2002

(65) Prior Publication Data

US 2002/0180484 A1 Dec. 5, 2002

(30) Foreign Application Priority Data

Jun. 4, 2001 (JP) ........................................ 2001-167841

(51) Int. Cl.[7] .......................... H03K 19/00; H03L 7/00
(52) U.S. Cl. ........................................ 326/93; 327/144
(58) Field of Search ....................... 326/93–98; 327/141, 327/144, 145, 153, 161

(56) References Cited

U.S. PATENT DOCUMENTS

| 5,151,623 A | * | 9/1992 | Agrawal ..................... 326/40 |
| 5,638,015 A | * | 6/1997 | Gujral et al. ................. 327/144 |
| 5,767,701 A | * | 6/1998 | Choy et al. ..................... 326/93 |
| 5,831,459 A | * | 11/1998 | McDonald ................... 327/141 |
| 6,078,962 A | * | 6/2000 | Chappel et al. .............. 709/237 |
| 6,150,837 A | * | 11/2000 | Beal et al. ...................... 326/39 |

FOREIGN PATENT DOCUMENTS

| JP | 02244656 A | * | 9/1990 | ........... H01L/21/82 |
| JP | 06197006 A | * | 7/1994 | ......... H03K/19/096 |
| JP | 2914267 | | 4/1999 | |
| WO | WO 00/33201 | | 6/2000 | |

* cited by examiner

Primary Examiner—James H. Cho
(74) Attorney, Agent, or Firm—Young & Thompson

(57) ABSTRACT

In a semiconductor integrated circuit, a plurality of logic blocks formed on a semiconductor chip are respectively operated in sync with clock signals unique to the plurality of logic blocks. Data transfer between the plurality of logic blocks is performed in asynchronous transfer scheme.

7 Claims, 2 Drawing Sheets

ASYNCHRONOUS DATA TRANSFER BETWEEN LOGIC BOX WITH SYNCHRONIZATION CIRCUIT

BACKGROUND OF THE INVENTION

The present invention relates to a semiconductor integrated circuit and particularly to a semiconductor integrated circuit that operates in sync with clock signals.

The conventional semiconductor integrated circuit of that type generally includes plural logic circuits, plural flip-flops each for synchronizing the logic circuits with clock signals, and a clock generation circuit, which are formed on a semiconductor chip. The clock generation circuit produces clock signals to flip-flops formed at various portions on the semiconductor chip, thus operating the whole circuit in a synchronous mode.

In order to improve the operational rate of the semiconductor integrated circuit, it is required to operate it at higher clock frequency. However, the conventional semiconductor integrated circuit has the disadvantage in that because the whole circuit operates in sync with a single clock signal, the clock skew caused by an increased logic scale and chip size makes it difficult to increase the clock frequency. The clock skew means a delay difference between time periods for which clock signals reach to flip-flops respectively. The skew tends to become larger as the logic scale and chip area of a semiconductor integrated circuit increase. Recently, semiconductor integrated circuits are increasing their logical scale and their chip area. This makes it more difficult to increase the operational speed of semiconductor integrated circuits.

SUMMARY OF THE INVENTION

The present invention is made to solve the above-mentioned problems. An object of the present invention is to provide a semiconductor integrated circuit capable of reducing the clock skew without being influenced by its logic scale and its chip area, thus improving its operational rate.

In order to accomplish the above-mentioned object, a semiconductor integrated circuit according to the present invention comprises a plurality of logic blocks formed on a semiconductor chip, the plurality of logic blocks being respectively operated in sync with clock signals unique to the plurality of logic blocks, data transfer between the plurality of logic blocks being performed in asynchronous transfer scheme.

According to the present invention, the semiconductor integrated circuit further comprises a data line for connecting a first logic block at a data transfer source and a second logic block at a data transfer destination; and a clock line connected between said first logic block at the data transfer source and said second logic block at the data transfer destination. The first logic block at the data transfer source transfers data to the second logic block at the transfer destination via the data line and transfers a clock signal unique for the first logic block to the second logic block at the transfer destination via the clock line. The second logic block of the data transfer destination includes a synchronization circuit that synchronizes data transmitted via the data line with the clock signal unique to the second logic block, using a clock signal transmitted via the clock line and a clock signal unique to the second logic block.

In this configuration, the range over which the operation synchronized with the clock signal is required can be restricted within each logic block. Hence, the clock skew can be reduced, compared with the case where the whole circuit on a semiconductor chip operates in sync with one clock signal. As a result, the operational speed of the semiconductor integrated circuit can be operated at high operational rate.

BRIEF DESCRIPTION OF THE DRAWINGS

This and other objects, features and advantages of the present invention will become more apparent from the following detailed description taken in conjunction with the attached drawings, in which.

DESCRIPTION OF THE EMBODIMENTS

An embodiment of the present invention will be described below by referring to the attached drawings.

Figure 1:
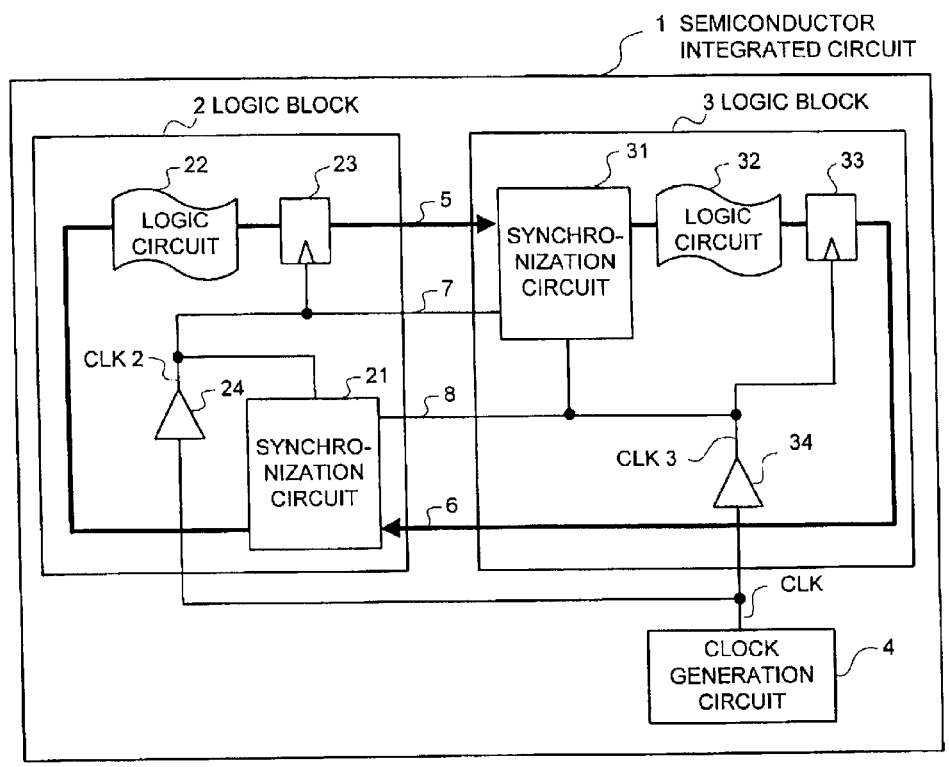
FIG. 1 is a block diagram illustrating a semiconductor integrated circuit according to an embodiment of the present invention.

FIG. 1 is a block diagram illustrating a semiconductor integrated circuit according to an embodiment of the present invention. Referring to FIG. 1, the semiconductor integrated circuit 1 is built in a single semiconductor chip. The semiconductor integrated circuit 1 includes two logic blocks 2 and 3, a clock generation circuit 4, data lines 5 and 6 which are connected between the logic blocks 2 and 3, and clock lines 7 and 8 which are connected between the logic blocks 2 and 3.

The clock generation circuit 4 produces a clock signal CLK to the logic blocks 2 and 3.

The logic block 2 includes a synchronization circuit 21, a logic circuit 22, a flip-flop 23, and a buffer 24. The logic block 3 includes a synchronization circuit 31, a logic circuit 32, a flip-flop 33, and a buffer 34. The logic block 2 operates in sync with the clock signal CLK 2 being unique thereto while the logic block 3 operates in sync with the clock signal CLK 3 being unique thereto. In order to obtain the clock signal CLK 2, the buffer 24 in the logic block 2 converts the clock signal CLK from the clock generation circuit 4 into the clock signal unique to the logic block 2. In order to obtain the clock signal CLK 3, the buffer 34 in the logic block 3 converts the clock signal CLK from the clock generation circuit 4 into the clock signal unique to the logic block 3.

Referring to FIG. 1, the logic block 2 (or 3) includes one synchronization circuit, one logic circuit, and one flip-flop. In actuality, the logic block 2 (or 3) includes plural synchronization circuits, plural logic circuits, and plural flip-flops, which operate in sync with clock signals being unique to the logic block 2 (or 3). The logic block 2 (or 3) aims at restricting the range over which an operation synchronized with clock signals is required to the inside of the logic block 2 (or 3), thus decreasing the clock skew. Hence, it is desired that the shape the logic block 2 (or 3) is nearly square. Providing the logic blocks for every function is desirable to facilitate the clock design. For example the logic block 2 is a vector operation unit and the logic block 3 is a control unit.

Using the clock signal CLK 3 transmitted from the buffer 34 in the logic block 3 via the clock line 8 and the clock signal CLK 2 transmitted from the buffer 24, the synchronization circuit 21 in the logic block 2 synchronizes the data transmitted from the logic block 3 via the data line 6 with the clock signal CLK 2. The data line 6 is nearly the same as the clock line 8 in length and delay amount.

Figure 2:
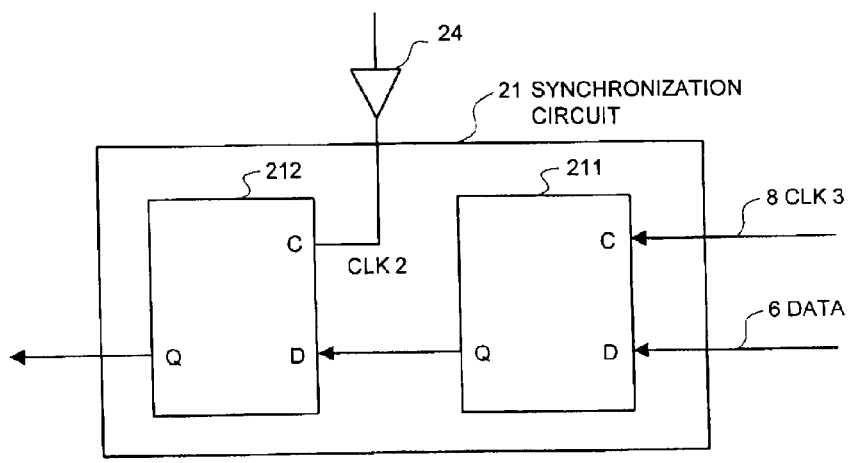
FIG. 2 is a block diagram illustrating the configuration of the synchronization circuit 21 shown in FIG. 1.

FIG. 2 is a block diagram illustrating the configuration of the synchronization circuit 21. The synchronization 21 includes a flip-flop 211 and a flip-flop 212. The flip-flop 211 holds data input via the data line 6 in accordance with the clock signal CLK 3 input via the clock line 8. The flip-flop 212 holds the output of the flip-flop 211 in accordance with the clock signal CLK 2 unique to the logic block 2. The synchronization circuit 21 may be formed of a FIFO, without being restricted to the above-mentioned configuration.

The logic circuit 22 performs a logical operation of data output from the synchronization circuit 21 and synchronized with the clock signal CLK 2 and then outputs the computational result.

The flip-flop 23 holds the output of the logic circuit 22 in accordance with the clock signal CLK 2 sent via the buffer 24 and then sends it to the logic block 3 via the data signal line 5.

In the logic block 3, using the clock signal CLK 2 transmitted from the buffer 24 (in the logic block 2) via the clock line 7 and the clock signal CLK 3 unique to the logic block 3, the synchronization of circuit 31 synchronizes the data transmitted from the logic block 2 via the data line 5 with the clock signal CLK 3. The synchronization circuit 31 has the configuration identical to the synchronization circuit 21. The data line 5 is nearly the same as the clock line 7 in delay amount.

The logic circuit 32 performs logical operation of data output from the synchronization circuit 31 and synchronized with the clock signal CLK 3 and then outputs the computational result.

The flip-flop 33 holds the output of the logic circuit 32 in accordance with the clock signal CLK 3 sent via the buffer 34 and then sends it to the logic block 2 via the data line 6.

Next, the operation of the semiconductor integrated circuit according to the present embodiment will be described below by referring to FIG. 3.

Figure 3:
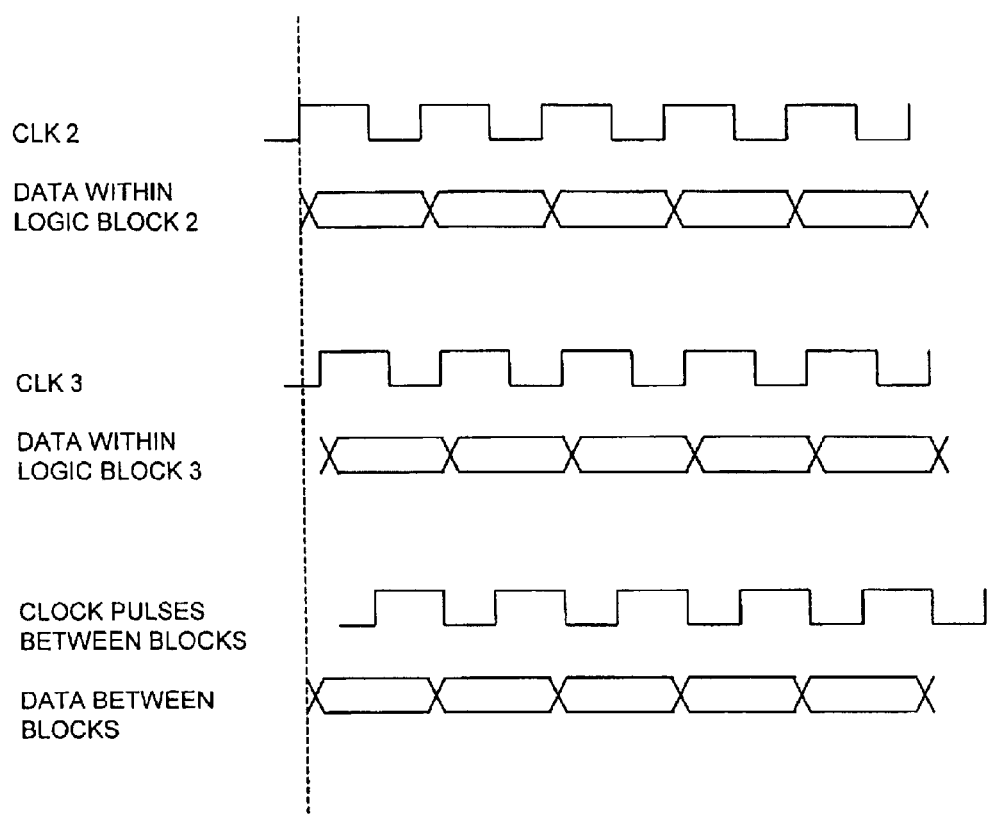
FIG. 3 is a time chart for the operation of the embodiment shown in FIG. 1.

In the logic block 2, the combination of the synchronization circuit 21 and the flip-flop 23, as shown in FIG. 3, holds and outputs data in sync with the clock signal CLK 2 unique to the logic block 2.

In contrast, the combination of the synchronization circuit 31 and the flip-flop 33 in the logic block 3, as shown in FIG. 3, holds and outputs data in sync with the clock signal CLK 3 unique to the logic block 3.

The timing of the clock signal CLK 2 in the logic block 2 and the timing of the clock signal CLK 3 in the logic block 3 are not totally related to each other, as shown in FIG. 3. Consequently, as shown in FIG. 3, data signals and clock signals, which are exchanged between the blocks 2 and 3 via the data lines 5 and 6 and via the clock lines 7 and 8, are not synchronized with the clock signal CLK 2 or CLK 3 in the counter logic block for communications.

As described above, the synchronization circuit 21 synchronizes data transmitted from a counter logic block (or the logic block 3) with the clock signal CLK 2 unique to the logic block 2. Moreover, the synchronization circuit 31 synchronizes data transmitted from a counter logic block (or the logic block 2) with the clock signal CLK 3 unique to the logic block 3. For that reason, even if data exchanged between the logic blocks 2 and 3 are not synchronized with the clock signal CLK 2 or CLK 3, the logic blocks 2 and 3 can accurately process received data.

This embodiment uses two logic blocks fabricated on a semiconductor chip. However, three or more logic blocks may be used.

As described above, according to the present invention, because the range over which the operation synchronized with the clock signal is required is restricted within each logic block, the clock skew which influences the operational frequency can be reduced, so that the operational speed can be improved.

Moreover, according to the present invention, the clock design is merely performed for every logic block. The clock design can be simplified, compared with the case where the clock design is performed to the whole circuit on a semiconductor chip.

The entire disclosure of Japanese Patent Application No. 2001-167841 filed on Jul. 4, 2001 including specification, claims, drawings and summary are incorporated herein by reference in its entirely.

What is claimed is:

1. A semiconductor integrated circuit comprising:
   a plurality of logic blocks formed on a semiconductor chip, said plurality of logic blocks being respectively operated in sync with clock signals unique to said plurality of logic blocks, data exchange between said plurality of logic blocks being performed in asynchronous transfer scheme;
   a data line connected between a first logic block at a data transfer source and a second logic block at a data transfer destination; and
   a clock line for connecting said first logic block at said data transfer source and said second logic block at said data transfer destination;
   wherein said first logic block at said data transfer source transfers data to said second logic block at said data transfer destination via said data line and transfers a clock signal unique for aid first logic block to said second logic block at said data transfer destination via said clock line;
   said second logic block of said data transfer destination including a synchronization circuit that synchronizes said data transmitted via said data line with a clock signal unique to said second logic block, using a clock signal transmitted via said clock line and said clock signal unique to said second logic block.

2. The semiconductor circuit defined in claim 1, wherein each of said plurality of logic blocks comprises:
   a plurality of logic circuits; and
   a flip-flop for synchronizing each of said plurality of logic circuits with a clock signal unique to its own logic block.

3. The semiconductor integrated circuit defined in claim 2, wherein each of said plurality of logic blocks receives the same clock signal from a clock generation circuit.

4. A semiconductor integrated circuit comprising:
   a semiconductor chip;
   a plurality of logic blocks disposed in said semiconductor chip, each of said plurality of logic blocks operating in sync with a clock signal unique to each of said plurality of logic blocks;
   a data line for transferring data from a first logic block at a data transfer source to a second logic block at a data transfer destination; and
   a clock line for transferring a clock signal for said first logic block, from said first logic block at said data transfer source to said second logic block at said data transfer destination;
   wherein each of said plurality of logic blocks has a synchronization circuit that synchronizes data transferred via said data line with said clock signal unique to its own logic block, based on a clock signal transmitted via said clock line and said clock signal unique to said own logic block.

5. The semiconductor integrated circuit defined in claim 4, wherein each of said plurality of logic blocks comprises:
   a plurality of logic circuits; and
   a flip-flop for synchronizing each of said plurality of logic circuits with said clock signal unique to its own logic block.

6. The semiconductor integrated circuit defined in claim 4, wherein each of said plurality of logic blocks has a clock generation circuit for supplying the same clock signal.

7. A semiconductor integrated circuit comprising:
   a semiconductor chip;
   a plurality of logic blocks disposed in said semiconductor chip;
   a clock generation circuit for supplying the same clock signal to each of said plurality of logic blocks;
   a data line connected between a first logic block at a data transfer source and a second logic block at a data transfer destination; and
   a clock line for transferring a clock signal for said first logic block, from said first logic block at said data transfer source to said second logic block at said data transfer destination;

each of said plurality of logic blocks including:
   a converter for converting the same clock signal supplied from said clock generation circuit into a clock signal unique to its own logic block;
   a plurality of logic circuits operating based on said clock signal unique to said its own logic block;
   a flip-flop for transferring data to a logic block at said data transfer destination via said data line and in sync with said clock signal unique to its own logic block; and
   a synchronization circuit for synchronizing data transferred via said data line with said clock signal unique to its own logic block, based on a clock signal transmitted via said clock line and a clock signal unique to its own logic block.

* * * * *